(12) United States Patent
Sakui et al.

(10) Patent No.: US 9,293,213 B2
(45) Date of Patent: *Mar. 22, 2016

(54) SENSING DATA STORED IN MEMORY

(71) Applicant: Micron Technology, Inc., Boise, ID (US)

(72) Inventors: Koji Sakui, Setagayaku (JP); Peter Feeley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/527,416

(22) Filed: Oct. 29, 2014

(65) Prior Publication Data

US 2015/0078099 A1    Mar. 19, 2015

Related U.S. Application Data

(63) Continuation of application No. 13/649,886, filed on Oct. 11, 2012, now Pat. No. 8,897,072.

(51) Int. Cl.
| | |
|---|---|
| *G11C 16/04* | (2006.01) |
| *G11C 16/26* | (2006.01) |
| *G11C 16/06* | (2006.01) |

(52) U.S. Cl.
CPC ............. *G11C 16/26* (2013.01); *G11C 16/04* (2013.01); *G11C 16/0483* (2013.01); *G11C 16/06* (2013.01)

(58) Field of Classification Search
CPC .... G11C 16/0482; G11C 16/24; G11C 16/10; H01L 27/115

USPC .......................... 365/185.17, 185.21, 185.25
See application file for complete search history.

(56) References Cited

U.S. PATENT DOCUMENTS

| | | | |
|---|---|---|---|
| 7,203,087 B2 | 4/2007 | Resta et al. | |
| 8,897,072 B2* | 11/2014 | Sakui et al. | ............ 365/185.17 |
| 2001/0042185 A1 | 11/2001 | Franaszek et al. | |
| 2002/0031035 A1 | 3/2002 | Tsuji et al. | |
| 2007/0133285 A1 | 6/2007 | Lee et al. | |
| 2007/0171721 A1 | 7/2007 | Shibata | |
| 2007/0171746 A1 | 7/2007 | Tsao et al. | |
| 2011/0179249 A1 | 7/2011 | Hsiao | |
| 2012/0327718 A1* | 12/2012 | Lee | ............ 365/185.22 |
| 2013/0117620 A1 | 5/2013 | Joo et al. | |

OTHER PUBLICATIONS

Sakui, et al., U.S. Appl. No. 13/564,458, entitled, "Partial Block Memory Operations," filed Aug. 1, 2012, (101 pages).

* cited by examiner

*Primary Examiner* — Huan Hoang
(74) *Attorney, Agent, or Firm* — Brooks, Cameron & Huebsch, PLLC

(57) ABSTRACT

The present disclosure includes apparatuses and methods for sensing data stored in memory. A number of embodiments include an array of memory cells, and a controller coupled to the array and configured to sense a page of memory cells coupled to an activated access line by pre-charging only a single subset of a number of data lines coupled to the page, wherein more than two subsets of data lines are coupled to the page and the single subset is coupled to those memory cells storing at least a portion of a single sector of data of the page, and sensing the single subset of the number of data lines to determine the at least a portion of the single sector of data.

19 Claims, 9 Drawing Sheets

SENSING DATA STORED IN MEMORY

PRIORITY INFORMATION

This application is a Continuation of U.S. application Ser. No. 13/649,886, filed Oct. 11, 2012, the contents of which are incorporated herein by reference.

TECHNICAL FIELD

The present disclosure relates generally to semiconductor memory and methods, and more particularly, to sensing data stored in memory.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can retain stored data when not powered and can include NAND flash memory, NOR flash memory, phase change random access memory (PCRAM), resistive random access memory (RRAM), and magnetic random access memory (MRAM), among others.

Memory devices can be combined together to form a solid state drive (SSD). An SSD can include non-volatile memory (e.g., NAND flash memory and/or NOR flash memory), and/or can include volatile memory (e.g., DRAM and/or SRAM), among various other types of non-volatile and volatile memory. Flash memory devices can include memory cells storing data in a charge storage structure such as a floating gate, for instance, and may be utilized as non-volatile memory for a wide range of electronic applications. Flash memory devices typically use a one-transistor memory cell that allows for high memory densities, high reliability, and low power consumption.

Memory cells in an array architecture can be programmed to a desired state. For instance, electric charge can be placed on or removed from the charge storage structure (e.g., floating gate) of a memory cell to program the cell to a particular data state. The stored charge on the charge storage structure of the memory cell can indicate a threshold voltage (Vt) of the cell.

For example, a single level cell (SLC) can be programmed to a targeted one of two different data states, which can be represented by the binary units 1 or 0. Some flash memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells since each cell can represent more than one digit (e.g., more than one bit).

A state of a flash memory cell can be determined by sensing the stored charge on the charge storage structure (e.g., the Vt) of the cell. For example, sensing operations (e.g., read and/or program verify operations) can use sensing voltages to sense the Vt of flash memory cells and thereby determine the state of the cells.

DETAILED DESCRIPTION

Figure 1:
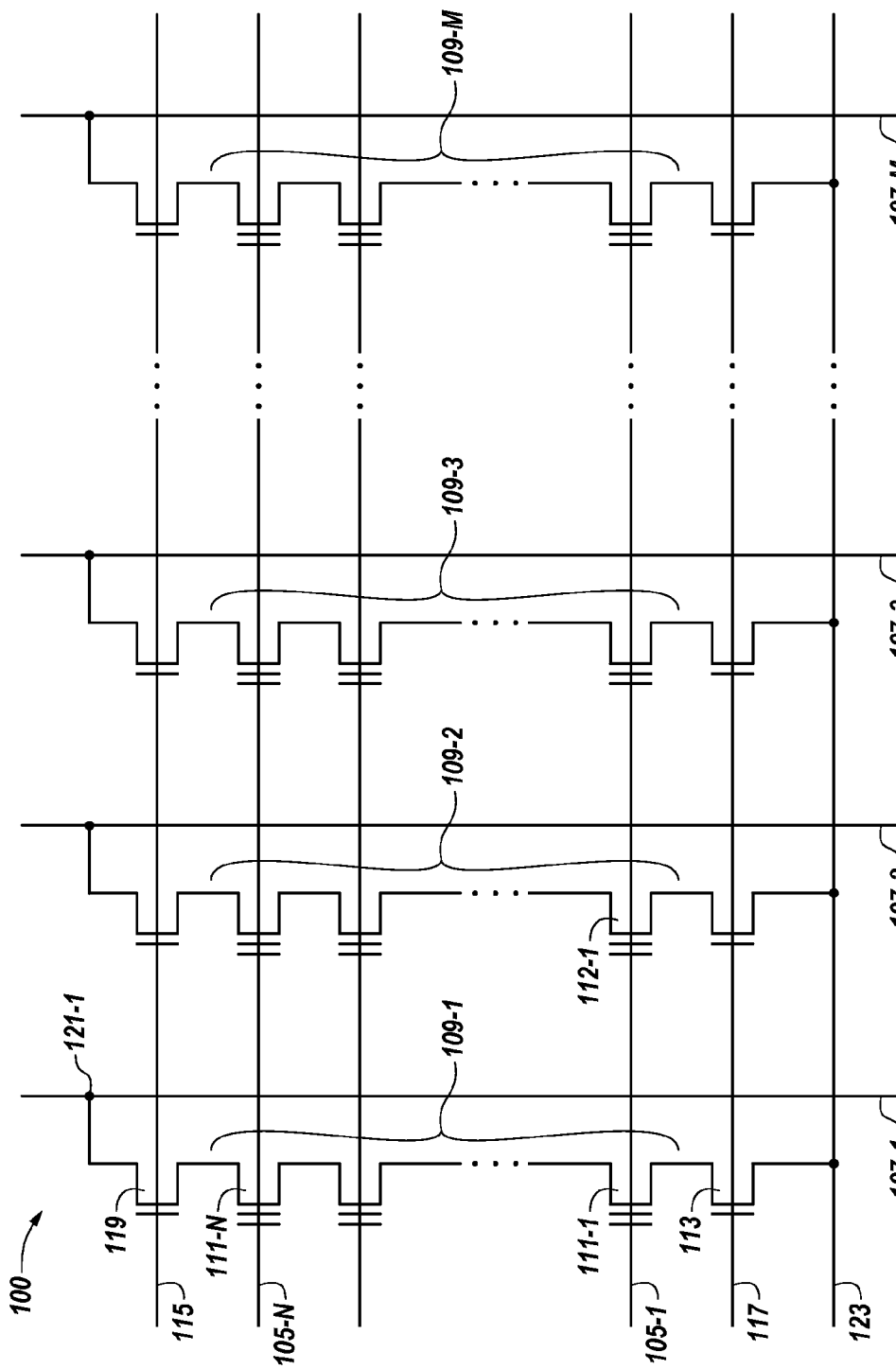
FIG. 1 illustrates a schematic diagram of a portion of a non-volatile memory array in accordance with a number of embodiments of the present disclosure.

The present disclosure includes apparatuses and methods for sensing data stored in memory. A number of embodiments include an array of memory cells, and a controller coupled to the array and configured to sense a page of memory cells coupled to an activated access line by pre-charging only a single subset of a number of data lines coupled to the page, wherein more than two subsets of data lines are coupled to the page and the single subset is coupled to those memory cells storing at least a portion of a single sector of data of the page, and sensing the single subset of the number of data lines to determine the at least a portion of the single sector of data.

In previous sensing operations, a group of memory cells (e.g., a physical page of memory cells) storing a page of data (e.g., a logical page) may be sensed together (e.g., at the same time) as a functional group. However, as the page size associated with a memory device increases, the amount of time used to sense the page and/or the amount of power consumed in sensing the page can increase. Sensing operations in accordance with a number of embodiments of the present disclosure, in contrast, can be shorter and/or consume less power than such previous sensing operations.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more such things. For example, a number of memory cells can refer to one or more memory cells. Additionally, the designators "M" and "N" as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 330 may reference element "30" in FIG. 3, and a similar element may be referenced as 730 in FIG. 7. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

FIG. 1 illustrates a schematic diagram of a portion of a non-volatile memory array 100 in accordance with a number of embodiments of the present disclosure. The embodiment of FIG. 1 illustrates a NAND architecture non-volatile memory array. However, embodiments described herein are not limited to this example. As shown in FIG. 1, memory array 100 includes access lines (e.g., word lines 105-1, . . . , 105-N) and intersecting data lines (e.g., local bit lines) 107-1, 107-2, 107-3, . . . , 107-M. For ease of addressing in the digital environment, the number of word lines 105-1, . . . , 105-N and the number of local bit lines 107-1, 107-2, 107-3, . . . , 107-M can be some power of two (e.g., 256 word lines by 4,096 bit lines).

Memory array 100 includes NAND strings 109-1, 109-2, 109-3, . . . , 109-M. Each NAND string includes non-volatile memory cells 111-1, . . . , 111-N, each communicatively coupled to a respective word line 105-1, . . . , 105-N. Each NAND string (and its constituent memory cells) is also associated with a local bit line 107-1, 107-2, 107-3, . . . , 107-M. The non-volatile memory cells 111-1, . . . , 111-N of each NAND string 109-1, 109-2, 109-3, . . . , 109-M are connected in series source to drain between a source select gate (SGS) (e.g., a field-effect transistor (FET)) 113, and a drain select gate (SGD) (e.g., FET) 119. Each source select gate 113 is configured to selectively couple a respective NAND string to a common source 123 responsive to a signal on source select line 117, while each drain select gate 119 is configured to selectively couple a respective NAND string to a respective bit line responsive to a signal on drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to bit line 107-1 of the corresponding NAND string 109-1 at drain contact 121-1. The source of drain select gate 119 is connected to the drain of the last memory cell 111-N (e.g., a floating-gate transistor) of the corresponding NAND string 109-1.

In a number of embodiments, construction of non-volatile memory cells 111-1, . . . , 111-N includes a charge storage structure such as a floating gate, and a control gate. Non-volatile memory cells 111-1, . . . , 111-N have their control gates coupled to a word line, 105-1, . . . , 105-N respectively. A "column" of the non-volatile memory cells, 111-1, . . . , 111-N, make up the NAND strings 109-1, 109-2, 109-3, . . . , 109-M, and are coupled to a given local bit line 107-1, 107-2, 107-3, . . . , 107-M, respectively. A "row" of the non-volatile memory cells are those memory cells commonly coupled to a given word line 105-1, . . . , 105-N. The use of the terms "column" and "row" is not meant to imply a particular linear (e.g., vertical and/or horizontal) orientation of the non-volatile memory cells. A NOR array architecture would be similarly laid out, except that the string of memory cells would be coupled in parallel between the select gates.

In a number of embodiments, array 100 can be a portion (e.g., a portion of a level) of a three-dimensional array (e.g., a multi-level array; not shown in FIG. 1) in which other arrays similar to array 100 are at different levels, for example above and/or below array 100. Such a three-dimensional array will be further described herein (e.g., in connection with FIG. 6).

As will be further described herein, subsets of cells coupled to a selected word line (e.g., 105-1, . . . , 105-N) can be programmed and/or sensed (e.g., read) together (e.g., at the same time). A programming operation (e.g., a write operation) can include applying a number of program pulses (e.g., 16V-20V) to a selected word line in order to increase the threshold voltage (Vt) of selected cells coupled to that selected access line to a desired program voltage level corresponding to a target (e.g., desired) data state.

A sense operation, such as a read or program verify operation, can include sensing a voltage and/or current change of a bit line coupled to a selected cell in order to determine the data state of the selected cell. The sensing operation can include providing a voltage to (e.g., biasing) a bit line (e.g., bit line 107-1) associated with a selected memory cell above a voltage (e.g., bias voltage) provided to a source line (e.g., source line 123) associated with the selected memory cell. A sensing operation could alternatively include precharging the bit line followed with discharge when a selected cell begins to conduct, and sensing the discharge.

Sensing the state of a selected cell can include providing a number of ramped sensing signals (e.g., read voltages) to a selected word line while providing a number of pass signals (e.g., read pass voltages) to the word lines coupled to the unselected cells of the string sufficient to place the unselected cells in a conducting state independent of the Vt of the unselected cells. The bit line corresponding to the selected cell being read and/or verified can be sensed to determine whether or not the selected cell conducts in response to the particular sensing voltage applied to the selected word line. For example, the data state of a selected cell can be determined by the word line voltage at which the bit line current reaches a particular reference current associated with a particular state.

As one of ordinary skill in the art will appreciate, in a sensing operation performed on a selected memory cell in a NAND string, the unselected memory cells of the string are biased so as to be in a conducting state. In such a sensing operation, the data state of the selected cell can be determined based on the current and/or voltage sensed on the bit line corresponding to the string. For instance, the data state of the selected cell can be determined based on whether the bit line current changes by a particular amount or reaches a particular level in a given time period.

When the selected cell is in a conductive state, current flows between the source line contact at one end of the string and a bit line contact at the other end of the string. As such, the current associated with sensing the selected cell is carried through each of the other cells in the string and the select transistors.

Figure 2:
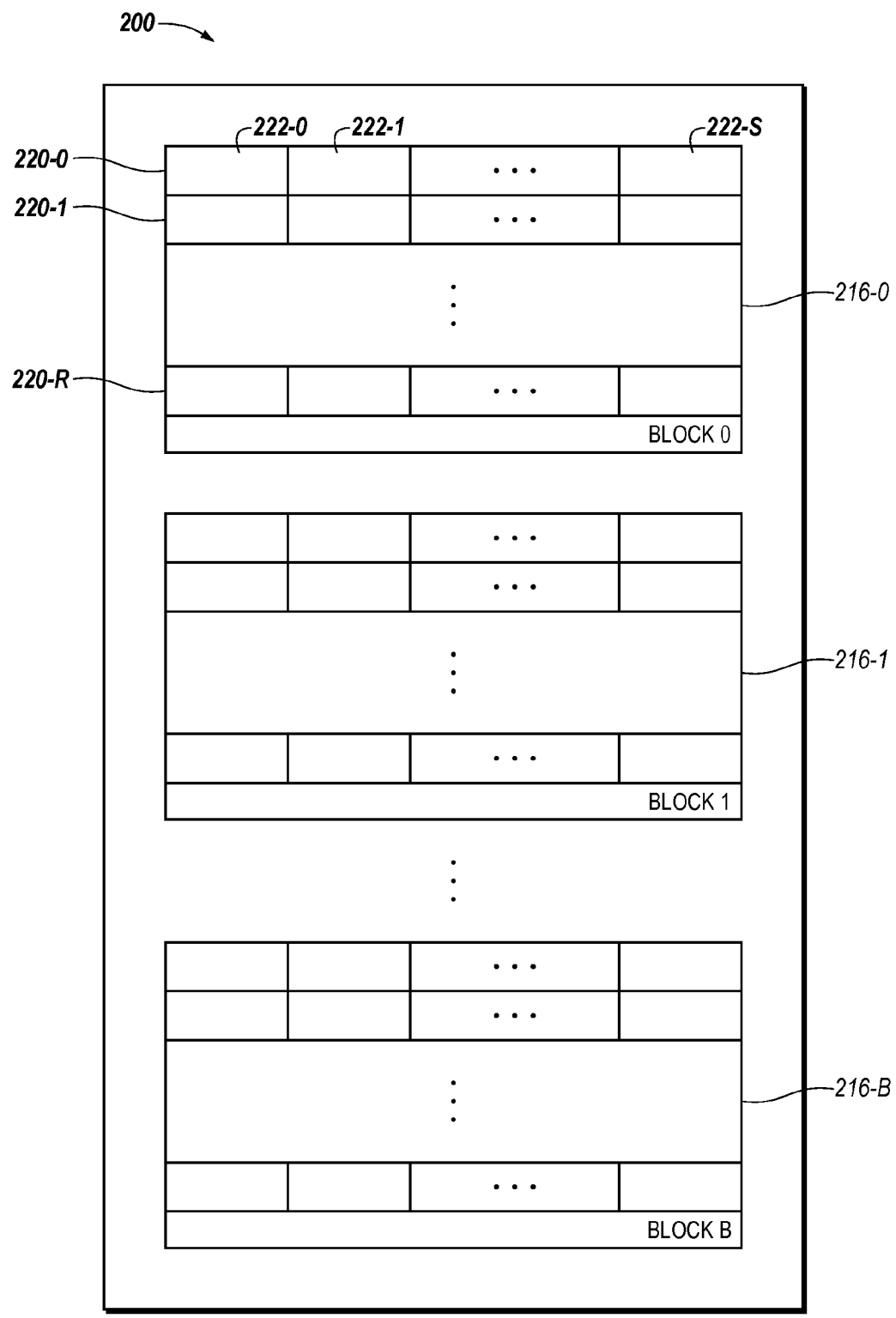
FIG. 2 illustrates a diagram of a portion of a memory array having a number of physical blocks in accordance with a number of embodiments of the present disclosure.

FIG. 2 illustrates a diagram of a portion of a memory array 200 having a number of physical blocks in accordance with a number of embodiments of the present disclosure. Memory array 200 can be, for example, memory array 100 previously described in connection with FIG. 1.

As shown in FIG. 2, memory array 200 has a number of physical blocks 216-0 (BLOCK 0), 216-1 (BLOCK 1), . . . , 216-B (BLOCK B) of memory cells. The memory cells can be single level cells and/or multilevel cells. As an example, the number of physical blocks in memory array 200 may be 128 blocks, 512 blocks, or 1,024 blocks, but embodiments are not limited to a particular multiple of 128 or to any particular number of physical blocks in memory array 200.

In the example shown in FIG. 2, each physical block 216-0, 216-1, . . . , 216-B includes memory cells which can be erased together as a unit (e.g., the cells in each physical block can be erased in a substantially simultaneous manner). For instance, the memory cells in each physical block can be erased together in a single erase operation.

As shown in FIG. 2, each physical block 216-0, 216-1, . . . , 216-B contains a number of physical rows (e.g., 220-0, 220-1, . . . , 220-R) of memory cells coupled to access lines (e.g., word lines). The number of rows (e.g., word lines) in each physical block can be 32, but embodiments are not limited to a particular number of rows 220-0, 220-1, . . . , 220-R per physical block.

Each row 220-0, 220-1, . . . , 220-R can include a number of pages of memory cells (e.g., physical pages). A physical page refers to a unit of programming (e.g., a number of memory cells that are programmed together as a functional group). In the embodiment shown in FIG. 2, each row 220-0, 220-1, . . . , 220-R comprises one physical page of memory cells. However, embodiments of the present disclosure are not so limited. For instance, in a number of embodiments, each row can comprise multiple physical pages of memory cells (e.g., an even page of memory cells coupled to even-numbered bit lines, and an odd page of memory cells coupled to odd numbered bit lines). Additionally, for embodiments including multilevel cells, a physical page of memory cells can store multiple pages (e.g., logical pages) of data (e.g., an upper page of data and a lower page of data, with each cell in a physical page storing one or more bits towards an upper page of data and one or more bits towards a lower page of data). A page of data can refer to an amount of data (e.g., a logical page) stored in a page of memory cells. As an example, a logical page size can be 4 kB, 8 kB, 16 kB, 32 kB, etc.

In a number of embodiments of the present disclosure, and as shown in FIG. 2, a page of memory cells can comprise a number of physical sectors 222-0, 222-1, . . . , 222-S. Each physical sector 222-0, 222-1, . . . , 222-S of cells can store a number of logical sectors of data, each corresponding to a portion of a particular page of data. As an example, a first logical sector of data stored in a particular physical sector can correspond to a logical sector corresponding to a first page of data, and a second logical sector of data stored in the particular physical sector can correspond to a second page of data. In a number of embodiments, a page of cells can comprise four physical sectors of cells, with each sector of cells storing one of four logical sectors corresponding to a page of data stored in the page of cells. As an example, each of four sectors of cells can store 4 kB of data corresponding to a 16 kB logical page stored in the page of cells. Each physical sector 222-0, 222-1, . . . , 222-S, can store system and/or user data, and can include overhead data, such as error correction code (ECC) information and logical block address (LBA) information.

As one of ordinary skill in the art will appreciate, logical block addressing is a scheme that can be used by a host for identifying a logical sector of data. For example, each logical sector can correspond to a unique logical block address (LBA). Additionally, an LBA may also correspond to a physical address. As an example, a logical sector of data can be a number of bytes of data (e.g., 256 bytes, 512 bytes, or 1,024 bytes). However, embodiments are not limited to these examples.

In various previous approaches, a page of memory cells may be sensed together as a functional group in order to determine a page of data stored therein. However, as the page size increases, sensing an entire page of cells together can take an increased amount of time and/or can increase power consumption associated with sensing a page. An increased amount of time for sensing a page can lead to reduced throughput, and increased power consumption can lead to violations of power constraints of a memory device, for instance.

In contrast, sensing operations in accordance with a number of embodiments of the present disclosure can include sensing only a single (e.g., one) subset of bit lines coupled to a page of memory cells, wherein the single subset is coupled to those memory cells storing a single sector of data of the page, in order to determine the single sector of data, as will be further described herein. As an additional example, sensing operations in accordance with a number of embodiments of the present disclosure can include separately sensing each of a plurality of subsets of bit lines coupled to the page (e.g., sensing each of the subsets of bit lines one subset at a time), wherein each subset is coupled to those memory cells storing a different sector of data of the page, in order to separately determine each of the sectors of data, as will be further described herein. That is, in sensing operations in accordance with a number of embodiments of the present disclosure, not all cells of a page may be sensed together (e.g., at the same time). Accordingly, sensing operations in accordance with a number of embodiments of the present disclosure can be shorter and/or consume less power than previous sensing operations (e.g., sensing operations in which an entire page of cells is sensed together).

Figure 3:
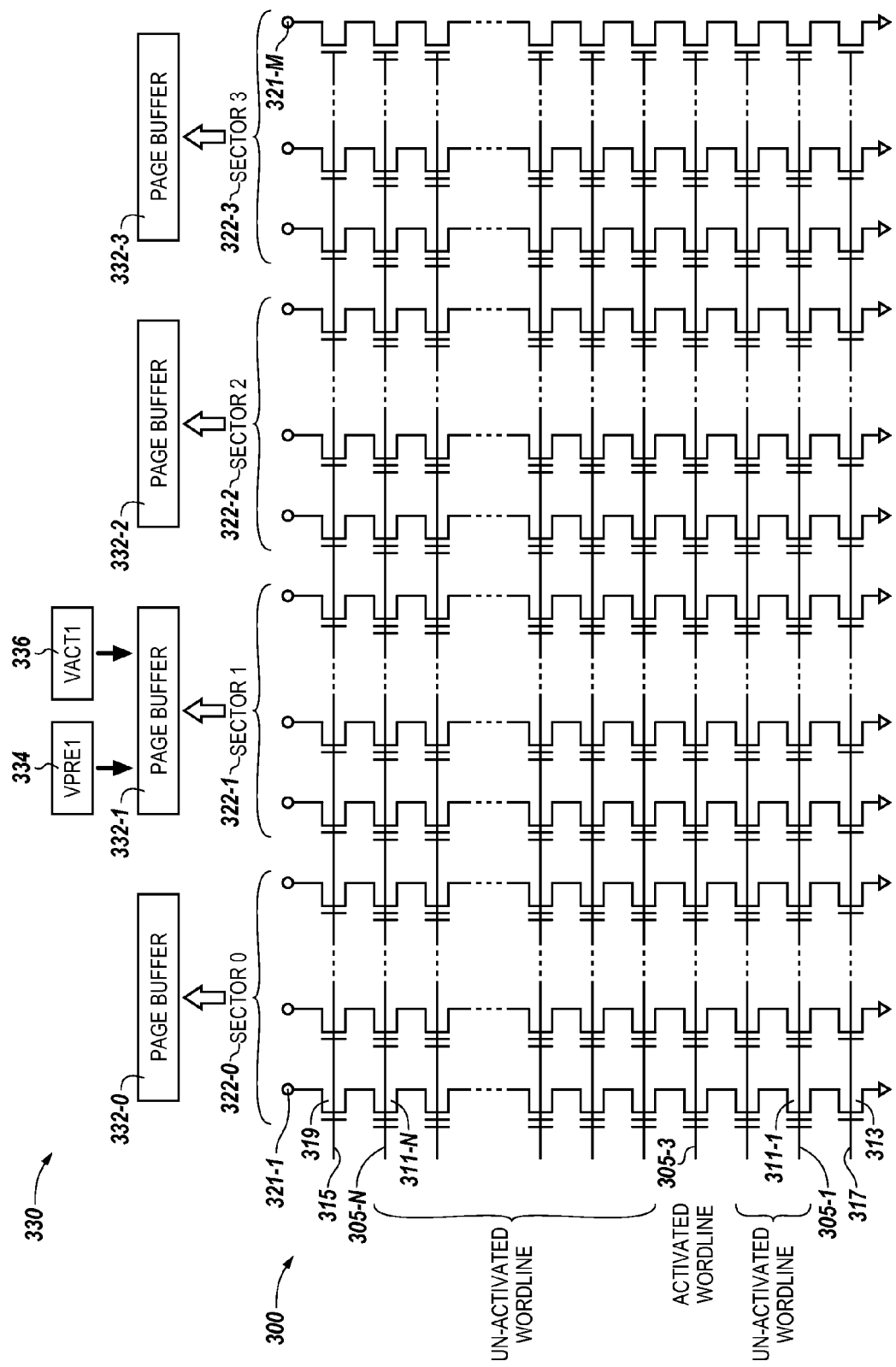
FIG. 3 illustrates a diagram of a portion of a memory device in accordance with a number of embodiments of the present disclosure.

FIG. 3 illustrates a diagram of a portion of a memory device 330 in accordance with a number of embodiments of the present disclosure. As shown in FIG. 3, memory device 330 includes a memory array 300. Memory array 300 can be an array such as memory array 100 or memory array 200 previously described in connection with FIGS. 1 and 2, respectively. For example, as illustrated in FIG. 3, and in a manner analogous to that previously described in connection with FIG. 1, memory array 300 can include non-volatile memory cells 311-1, . . . , 311-N coupled to a respective word line 305-1, . . . , 305-N and connected in series between an SGS 313 and an SGD 319. Each SGD 319 is configured to selectively couple a respective string of cells 311-1, . . . , 311-N to a respective bit line (not shown) responsive to a signal on drain select line 315. As such, the voltages and/or currents at the drain contacts 321-1, . . . , 321-M correspond to the voltages and/or currents on the respective bit lines. Therefore, sensing a respective bit line can include determining a voltage and/or current at a respective drain contact 321-1, . . . , 321-M.

Each word line 305-1 to 305-N of array 300 can comprise a physical page of memory cells. The memory cells of the page are coupled to a respective number of bit lines (e.g., at drain contacts 321-1 to 321-M). In a number of embodiments, and as shown in the example of FIG. 3, each page of memory cells comprises a number of (e.g., a plurality of) sectors of cells (e.g., cells commonly coupled to a respective word line), which can each store a number of sectors of data corresponding to a page of data stored in the physical page of cells. In the example illustrated in FIG. 3, each sector of cells comprises those cells of a particular word line which are coupled to a respective subset of the bit lines. The example of FIG. 3 includes four subsets of bit lines 322-0 (SECTOR 0), 322-1

(SECTOR 1), 322-2 (SECTOR 2), and 322-3 (SECTOR 3). Each subset 322-0, 322-1, 322-2, and 322-3 is coupled to those cells of a page storing a respective sector of data of the page of data stored in the page of memory cells. That is, the cells (e.g., a first sector of cells) coupled to a particular word line and to the subset of bit lines 322-0 store a first sector of data of the page, the cells (e.g., a second sector of cells) coupled to the particular word line and to the subset of bit lines 322-1 store a second sector of data of the page, the cells (e.g., a third sector of cells) coupled to the particular word line and to the subset of bit lines 322-2 store a third sector of data of the page, and the cells (e.g., a fourth sector of cells) coupled to the particular word line and to the subset of bit lines 322-3 store a fourth sector of data of the page.

As an example, a page can store 16 kilobytes (kB) of data (e.g., a logical page size of 16 kB), with each of the sectors of cells (e.g., the sectors of cells coupled to respective subsets of bit lines 322-0 to 322-3) storing 4 kB of data (e.g., logical sector size of 4 kB). However, embodiments of the present disclosure are not limited to a particular sector size, to a particular page size, or to a particular number of sectors per page. For instance, pages of cells can store more or fewer than 16 kB per page, sectors of cells can store more or fewer than 4 kB per sector, pages of cells can comprise more or fewer than four sectors of cells per page.

As shown in FIG. 3, memory device 330 can include a number (e.g., a plurality) of page buffers. For example, in the embodiment illustrated in FIG. 3, memory device 330 includes four page buffers 332-0, 332-1, 332-2, and 332-3. Further, as shown in FIG. 3, each page buffer can be associated with a different sector of data. For example, in the embodiment illustrated in FIG. 3, page buffer 332-0 is associated with sector 0 (e.g., memory cells coupled to the subset of bit lines 322-0), page buffer 332-1 is associated with sector 1 (e.g., memory cells coupled to the subset of bit lines 322-1), page buffer 332-2 is associated with sector 2 (e.g., memory cells coupled to the subset of bit lines 322-2), and page buffer 332-3 is associated with sector 3 (e.g., memory cells coupled to the subset of bit lines 322-3). As an example, each page buffer can be configured to store the same amount of data as is stored in its associated sector. For instance, in the embodiment illustrated in FIG. 3, each page buffer is configured to store 4 kB of data (e.g., each page buffer can be a 4 kB page buffer). However, embodiments of the present disclosure are not limited to a particular number of page buffers or a particular amount of data storable in the page buffers.

In a number of embodiments of the present disclosure, a page of memory cells coupled to an activated word line can be sensed by pre-charging only a single (e.g., one) subset of a number of bit lines coupled to the page, wherein the single subset is coupled to those memory cells storing a single (e.g., one) sector of data of the page, and sensing the single subset of bit lines to determine the single sector of data. For example, in the embodiment illustrated in FIG. 3, a page of memory cells coupled to activated word line 305-3 can be sensed by pre-charging bit line subset 322-1, and sensing bit line subset 322-1 to determine the data of sector 1. The single subset of bit lines can be pre-charged and sensed using, for example, a controller (not shown in FIG. 3) such as, for instance, controller 762 further describe in connection with FIG. 7.

The controller can pre-charge only the single subset of bit lines, for example, in response to receiving a command (e.g., a read command) to determine (e.g., read) the single sector of data. The command can be, for example, received from a host (not shown in FIG. 3), and can include the address (e.g., the LBA) of the single sector (e.g., to identify the sector whose data is to be determined). For example, in the embodiment illustrated in FIG. 3, the controller can pre-charge bit line subset 322-1 in response to receiving a command to read the data of sector 1.

The single subset of bit lines (e.g., bit line subset 322-1) can be pre-charged by, for instance, applying a pre-charge signal thereto. For example, in the embodiment illustrated in FIG. 3, bit line subset 322-1 can be pre-charged by applying pre-charge signal 334 (e.g., Vpre1) thereto via page buffer 332-1. Pre-charge signal 334 can be, for example, a positive supply voltage (e.g., Vcc) signal. That is, pre-charge signal 334 can have a positive polarity and an amplitude of Vcc.

After the single subset of bit lines is pre-charged (e.g., after applying the pre-charge signal to the single subset of bit lines), a word line coupled to the page of memory cells can be activated. The word line can be activated by, for instance, applying a sensing signal to the word line and applying a pass signal to the additional (e.g., remaining) word lines coupled to the page, SGD 319, and SGS 313. For example, in the embodiment illustrated in FIG. 3, word line 305-3 can be activated by applying a sensing signal thereto and applying a pass signal to the un-activated word lines, SGD 319, and SGS 313. The sensing signal can be, for example, a positive read voltage (e.g., Vread) signal, and the pass signal can be, for example, a positive read pass voltage (e.g., Vread pass) signal. That is, the sensing signal and the pass signal can have positive polarities and amplitudes of Vread and Vread pass, respectively. Vread can be, for example, 4 Volts, and Vpass read can be, for example, 7 Volts. However, embodiments of the present disclosure are not limited to a particular voltage amount for Vread or Vpass read.

The page of memory cells coupled to the activated word line can then be sensed by, for example, activating the page buffer associated with the single sector and outputting the data from the activated page buffer. The page buffer associated with the single sector can be activated by, for instance, applying an activation signal to the page buffer while the word line coupled to the page is activated (e.g., while the sensing signal is applied to the word line) and after pre-charging the single subset of bit lines. For example, the embodiment illustrated in FIG. 3, page buffer 332-1 can be activated by applying activation signal 336 (e.g., Vact1) to page buffer 332-1 while word line 305-3 is activated and after pre-charging bit line subset 322-1. Activation signal 336 can be, for example, the positive supply voltage (e.g., Vcc) signal.

The activated page buffer can then store the data (e.g., the single sector of data) and/or output (e.g., send) the data to the controller. For example, in the embodiment illustrated in FIG. 3, the controller can receive the data of sector 1 from page buffer 332-1 after activation signal 336 is applied to page buffer 332-1 (e.g., after page buffer 332-1 has been activated).

Figure 4:
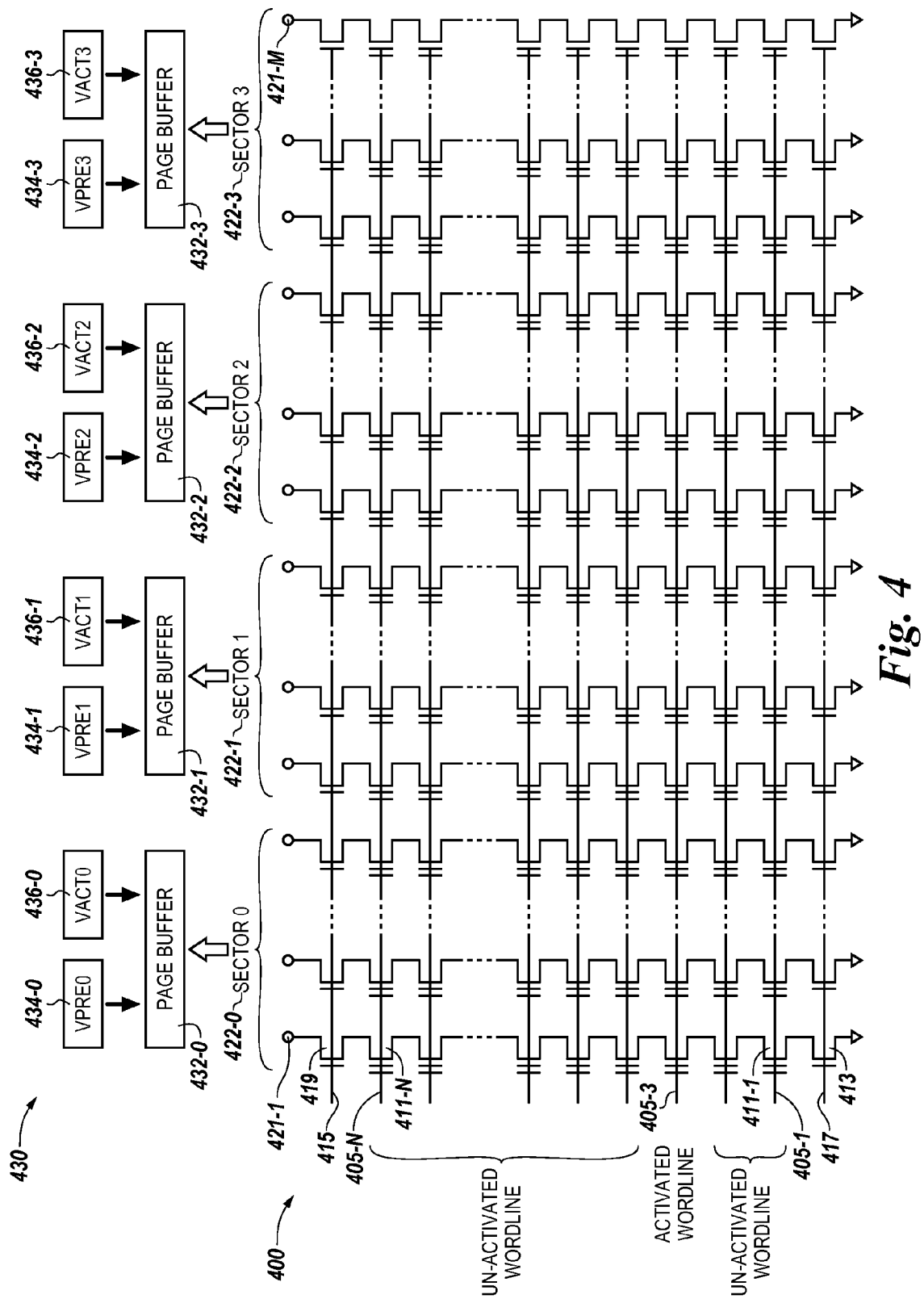
FIG. 4 illustrates a diagram of a portion of a memory device in accordance with a number of embodiments of the present disclosure.

FIG. 4 illustrates a diagram of a portion of a memory device 430 in accordance with a number of embodiments of the present disclosure. As shown in FIG. 4, memory device 430 includes a memory array 400. Memory array 400 can be analogous to memory array 300 previously described in connection with FIG. 3. For example, each word line 405-1 to 405-N of array 400 can comprise a physical page of memory cells comprising a number of sectors of cells which can each store a number of sectors of data corresponding to a page of data stored in the physical page of cells, in a manner analogous to that previously described in connection with FIG. 3. For instance, the example of FIG. 4 includes four subsets of bit lines 422-0 (SECTOR 0), 422-1 (SECTOR 1), 422-2 (SECTOR 2), and 422-3 (SECTOR 3) in a manner analogous to that previously described in connection with FIG. 3.

Further, memory device 430 can include a number (e.g., a plurality) of page buffers, with each page buffer associated with a different sector of data, in a manner analogous to that previously described in connection with FIG. 3. For example, in the embodiment illustrated in FIG. 4, memory device 430 includes page buffer 432-0 associated with sector 422-0, page buffer 432-1 associated with sector 422-1, page buffer 432-2 associated with sector 422-2, and page buffer 432-3 associated with sector 422-3.

In a number of embodiments of the present disclosure, a page of memory cells coupled to an activated word line can be sensed by separately pre-charging each of a plurality of subsets of bit lines coupled to the page, wherein each subset is coupled to those memory cells storing a different sector of data of the page, and separately sensing each of the subsets to separately determine each of the sectors of data. That is, each of the subsets of bit lines can be pre-charged and sensed one at a time, and each of the sectors of data can be determined one at a time as part of a continuous sense operation to sense the entire page. For example, in the embodiment illustrated in FIG. 4, a page of memory cells coupled to activated word line 405-3 can be sensed by pre-charging bit line subset 422-1 and sensing bit line subset 422-1 to determine the data of sector 1, pre-charging bit line subset 422-3 and sensing bit line subset 422-3 separately from (e.g., after) bit line subset 422-1 to separately determine the data of sector 3, pre-charging bit line subset 422-0 and sensing bit line subset 422-0 separately from (e.g., after) bit line subsets 422-1 and 422-3 to separately determine the data of sector 0, and pre-charging bit line subset 422-2 and sensing bit line subset 422-2 separately from (e.g., after) bit line subsets 422-1, 422-3, and 422-0 to separately determine the data of sector 2. However, embodiments of the present disclosure are not limited to a particular order for pre-charging and sensing bit line subsets 422-0 to 422-3 (e.g., bit line subsets 422-0 to 422-3 can be pre-charged and sensed in any order).

The subsets of bit lines can be separately pre-charged and separately sensed using, for example, a controller (not shown in FIG. 4) such as, for instance, controller 762 further described in connection with FIG. 7. For example, the controller can separately pre-charge and separately sense the subsets of bit lines in response to receiving a command (e.g., a read command) to separately determine (e.g., read) each sector of data. The command can be, for example, received from a host (not shown in FIG. 4), and can include the addresses (e.g., the LBAs) of each sector (e.g., to identify each sector whose data is to be determined). For example, in the embodiment illustrated in FIG. 4, the controller can separately pre-charge and separately sense each of bit line subsets 422-0 to 422-3 in response to receiving a command to read the data of each of sectors 0 to 3.

As an example, a page of memory cells can be sensed by pre-charging one (e.g., only one) of the subsets of bit lines, activating a word line coupled to the page of memory cells, activating the page buffer associated with the one subset of bit lines, outputting the data from the activated page buffer, and, while the access line is (e.g., remains) activated, separately pre-charging each of the remaining subsets of bit lines (e.g., while outputting the data from the previously activated page buffer), separately activating each of the remaining page buffers (e.g., the page buffers associated with the remaining subsets of bit lines), and separately outputting the data from the remaining page buffers after activation.

As an example, in the embodiment illustrated in FIG. 4, bit line subset 422-1 can be pre-charged, word line 405-3 can be activated (e.g., after pre-charging bit line subset 422-1), page buffer 432-1 can be activated (e.g., after activating word line 405-3), and data can be output from activated page buffer 432-1. Then, while word line 405-3 is activated, bit line subset 422-3 can be pre-charged, page buffer 432-3 can be activated, and data can be output from activated page buffer 432-3. Then, while word line 405-3 is activated, bit line subset 422-0 can be pre-charged, page buffer 432-0 can be activated, and data can be output from activated page buffer 432-0. Finally, while word line 405-3 is activated, bit line subset 422-2 can be pre-charged, page buffer 432-2 can be activated, and data can be output from activated page buffer 432-2. Further, bit line subset 422-3 can be pre-charged while the data is output from activated page buffer 432-1, bit line subset 422-0 can be pre-charged while the data is output from activated page buffer 432-3, and bit line subset 422-2 can be pre-charged while the data is output from activated page buffer 432-0. Embodiments of the present disclosure, however, are not limited to a particular order for pre-charging and sensing bit line subsets 422-0 to 422-3, as previously described herein.

Each subset of bit lines can be separately pre-charged by, for instance, separately applying a pre-charge signal thereto. For example, in the embodiment illustrated in FIG. 4, bit line subset 422-1 can be pre-charged by applying pre-charge signal 434-1 (e.g., Vpre1) thereto via page buffer 432-1, bit line subset 422-3 can be pre-charged by applying pre-charge signal 434-3 (e.g., Vpre3) thereto via page buffer 432-3, bit line subset 422-0 can be pre-charged by applying pre-charge signal 434-0 (e.g., Vpre0) thereto via page buffer 432-0, and bit line subset 422-2 can be pre-charged by applying pre-charge signal 434-2 (e.g., Vpre2) thereto via page buffer 432-2. Pre-charge signals 434-0, 434-1, 434-2, and 434-3 can be, for example, a positive supply voltage (e.g., Vcc) signal. That is, pre-charge signals 434-0, 434-1, 434-2, and 434-3 can have a positive polarity and an amplitude of Vcc.

The word line coupled to the page of memory cells can be activated after pre-charging the bit line subset associated with the first of the sectors to be sensed (e.g., after applying the pre-charge signal to the bit line subset associated with the first sector to be sensed). The word line can be activated by, for example, applying a sensing signal to the word line and applying a pass signal to the additional (e.g., remaining) word lines coupled to the page, SGD 419, and SGS 413. For example, in the embodiment illustrated in FIG. 4, word line 405-3 can be activated by applying a sensing signal thereto and applying a pass signal to the un-activated word lines, SGD 419, and SGS 413. The sensing signal and the pass signal can be, for example, analogous to the sensing signal and the pass signal previously described in connection with FIG. 3.

The page buffer associated with each respective sector can be activated by, for instance, applying an activation signal to that page buffer while the word line coupled to the page is activated (e.g., while the sensing signal is applied to the word line) and after pre-charging the bit line subset associated with that respective sector. For example, in the embodiment illustrated in FIG. 4, page buffer 432-1 can be activated by applying activation signal 436-1 (e.g., Vact1) to page buffer 432-1 while word line 405-3 is activated and after pre-charging bit line subset 422-1, page buffer 432-3 can be activated by applying activation signal 436-3 (e.g., Vact3) to page buffer 432-3 while word line 405-3 is activated and after pre-charging bit line subset 422-3, page buffer 432-0 can be activated by applying activation signal 436-0 (e.g., Vact0) to page buffer 432-0 while word line 405-3 is activated and after pre-charging bit line subset 422-0, and page buffer 432-2 can be activated by applying activation signal 436-2 (e.g., Vact2) to page buffer 432-2 while word line 405-3 is activated and after pre-charging bit line subset 422-2. Activation signals 436-0, 436-1, 436-2, and 436-3 can be, for example, the positive supply voltage (e.g., Vcc) signal.

Each respective activated page buffer can then store the data (e.g., the data of the sector associated with that page buffer) and/or output (e.g., send) the data to the controller. For example, in the embodiment illustrated in FIG. 4, the controller can receive the data of sector 1 from page buffer 432-1 after activation signal 436-1 is applied thereto (e.g., after page buffer 432-1 has been activated), the controller can receive the data of sector 3 from page buffer 432-3 after activation signal 436-3 is applied thereto, the controller can receive the data of sector 0 from page buffer 432-0 after activation signal 436-0 is applied thereto, and the controller can receive the data of sector 2 from page buffer 432-2 after activation signal 436-2 is applied thereto.

Figure 5:
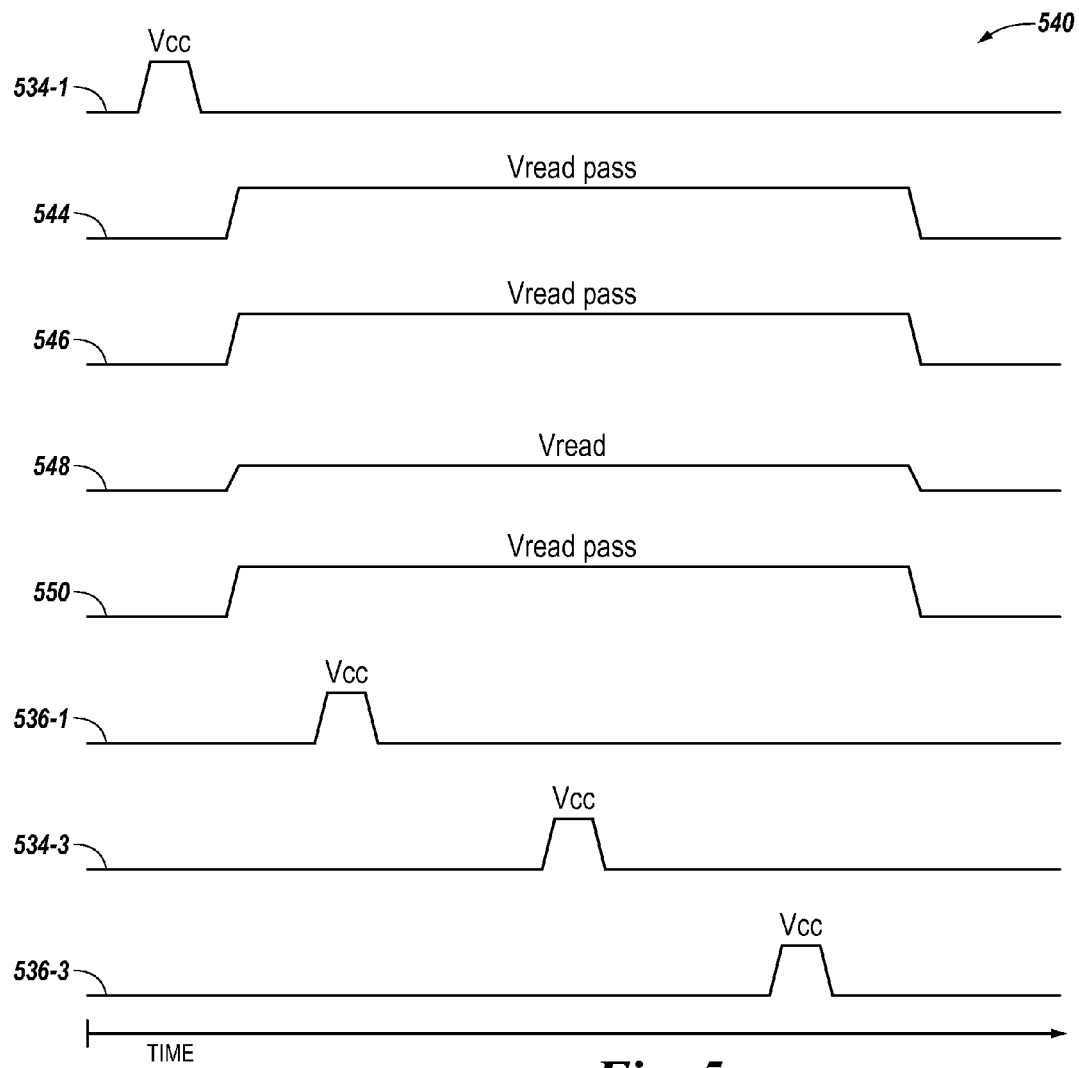
FIG. 5 illustrates a timing diagram including a number of signals associated with sensing a page of memory cells in accordance with a number of embodiments of the present disclosure.

FIG. 5 illustrates a timing diagram 540 including a number of signals associated with sensing a page of memory cells in accordance with a number of embodiments of the present disclosure. The page of memory cells can comprise a number of sectors of cells which can each store a number of sectors of data corresponding to a page of data stored in the physical page of cells, in a manner analogous to that previously described in connection with FIGS. 3 and 4.

As shown in FIG. 5, timing diagram 540 includes signal 534-1. Signal 534-1 can correspond to, for example, pre-charge signal 434-1 (e.g., Vpre1) previously described in connection with FIG. 4. For instance, a first subset of bit lines (e.g., bit line subset 422-1) can be pre-charged by applying signal 534-1 thereto in a manner analogous to that previously described in connection with FIG. 4. As shown in FIG. 5, signal 534-1 can have a positive polarity and an amplitude of Vcc.

As shown in FIG. 5, timing diagram 540 includes signals 544, 546, 548, and 550. Signal 548 can correspond to, for example, the sensing signal previously described in connection with FIG. 4, and signals 544, 546, and 550 can correspond to, for example, the pass signal previously described in connection with FIG. 4. For instance, a word line coupled to the page of memory cells (e.g., word line 405-3) can be activated by applying signal 548 to the word line, applying signal 546 to the additional (e.g., remaining) word lines coupled to the page, applying signal 544 to the SGD (e.g., SGD 419), and applying signal 550 to the SGS (e.g., SGS 413), in a manner analogous to that previously described in connection with FIG. 4.

As shown in FIG. 5, signal 548 can have a positive polarity and an amplitude of Vread, and signals 544, 546, and 550 can have a positive polarity and an amplitude of Vread pass. Vread can be, for example, 4 Volts, and Vread pass can be, for example, 7 Volts. However, embodiments of the present disclosure are not limited to a particular voltage amount for Vread or Vread pass. Further, as shown in FIG. 5, signals 544, 546, 548, and 550 can be applied after signal 534-1 is applied to the first subset of bit lines, signals 544, 546, 548, and 550 can have a longer duration than signal 534-1, and signals 544, 546, 548, and 550 can have the same duration.

As shown in FIG. 5, timing diagram 540 includes signal 536-1. Signal 536-1 can correspond to, for example, activation signal 436-1 (e.g., Vact1) previously described in connection with FIG. 4. For instance, a page buffer associated with a first sector of data can be activated by applying signal 536-1 thereto in a manner analogous to that previously described in connection with FIG. 4.

As shown in FIG. 5, signal 536-1 can have a positive polarity and the same amplitude as signal 534-1 (e.g., Vcc). Further, as shown in FIG. 5, signal 536-1 can be applied to the page buffer associated with the first sector of data after signal 534-1 is applied to the first subset of bit lines and while signals 544, 546, 548, and 550 are being applied, signal 536-1 can have the same duration as signal 534-1, and signal 536-1 can have a shorter duration than signals 544, 546, 548, and 550.

As shown in FIG. 5, timing diagram 540 includes signal 534-3. Signal 534-3 can correspond to, for example, pre-charge signal 434-3 (e.g., Vpre3) previously described in connection with FIG. 4. For instance, a second subset of bit lines (e.g., bit line subset 422-3) can be pre-charged by applying signal 534-3 thereto in a manner analogous to that previously described in connection with FIG. 4.

As shown in FIG. 5, signal 534-3 can have a positive polarity and the same amplitude as signals 534-1 and 536-1 (e.g., Vcc). Further, as shown in FIG. 5, signal 534-3 can be applied to the second subset of bit lines after signals 534-1 and 536-1 are applied and while signals 544, 546, 548, and 550 are being applied, signal 534-3 can have the same duration as signals 534-1 and 536-1, and signal 534-3 can have a shorter duration than signals 544, 546, 548, and 550.

As shown in FIG. 5, timing diagram 540 includes signal 536-3. Signal 536-3 can correspond to, for example, activation signal 436-3 (e.g., Vact3) previously described in connection with FIG. 4. For instance, a page buffer associated with a second sector of data can be activated by applying signal 536-3 thereto in a manner analogous to that previously described in connection with FIG. 4.

As shown in FIG. 5, signal 536-3 can have a positive polarity and the same amplitude as signals 534-1, 536-1, and 534-3 (e.g., Vcc). Further, as shown in FIG. 5, signal 536-3 can be applied to the page buffer associated with the second sector of data after signals 534-1, 536-1, and 534-3 are applied and while signals 544, 546, 548, and 550 are being applied, signal 536-3 can have the same duration as signals 534-1, 536-1, and 534-3, and signal 536-3 can have a shorter duration than signals 544, 546, 548, and 550.

Although not shown in FIG. 5, timing diagram 540 can also include signals that correspond to pre-charge signal 434-0 (e.g., Vpre0), activation signal 436-0 (e.g., Vact0), pre-charge signal 434-2 (e.g., Vpre2), and activation signal 436-2 (e.g., Vpre2) previously described in connection with FIG. 4. These signals can have a positive polarity and the same amplitude and duration as signals 534-1, 536-1, 534-3, and 536-3 (e.g., Vcc), and these signals can have a shorter duration than signals 544, 546, 548, and 550. These signals can be applied while signals 544, 546, 548, and 550 are being applied. The signal that corresponds to pre-charge signal 434-0 can be applied after signal 536-3 is applied, the signal that corresponds to activation signal 436-0 can be applied after the signal that corresponds to pre-charge signal 434-0 is applied, the signal that corresponds to pre-charge signal 434-2 can be applied after the signal that corresponds to activation signal 436-0 is applied, and the signal that corresponds to activation signal 436-2 can be applied after the signal that corresponds to pre-charge signal 434-2 is applied.

Figure 6:
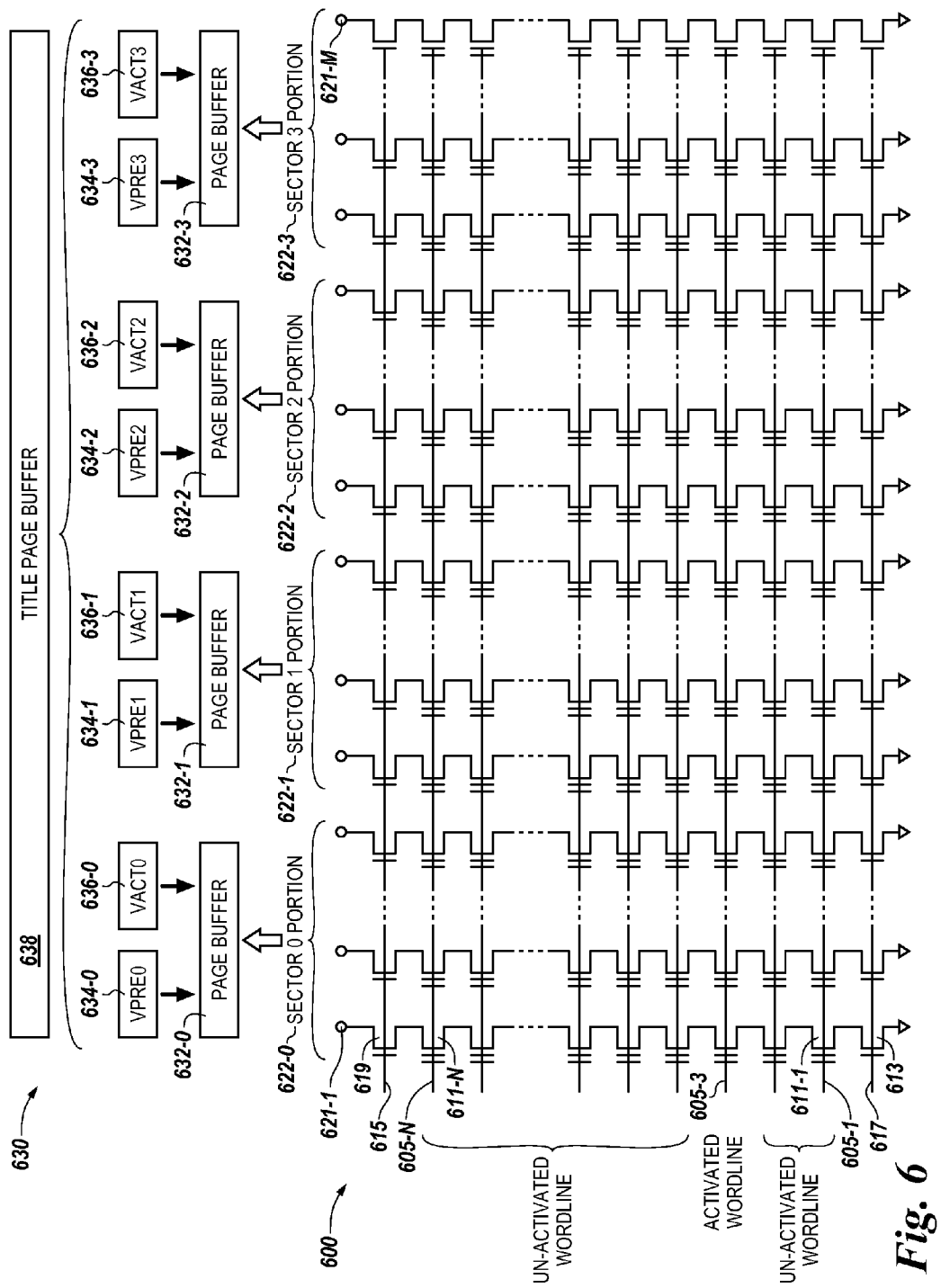
FIG. 6 illustrates a diagram of a portion of a memory device in accordance with a number of embodiments of the present disclosure.

FIG. 6 illustrates a diagram of a portion of a memory device 630 in accordance with a number of embodiments of the present disclosure. As shown in FIG. 6, memory device 630 includes a memory array 600. Memory array 600 can be analogous to memory arrays 300 and/or 400 previously described in connection with FIGS. 3 and 4, respectively. Further, memory array 600 can be a portion (e.g., a portion of a level) of a three-dimensional array (e.g., a multi-level array) in which other arrays similar to array 600 are at different levels, for example above and/or below array 600.

For example, each word line 605-1 to 605-N of array 600 can comprise a portion of a physical page of memory cells comprising portions of a number of sectors of cells which can each store portions of a number of sectors of data corresponding to a portion of a page of data stored in the portion of the physical page of cells. For instance, the example of FIG. 6 includes four subsets of bit lines 622-0 (sector 0 portion), 622-1 (sector 1 portion), 622-2 (sector 2 portion), and 622-3 (sector 3 portion). Each subset 622-0, 622-1, 622-2, and 622-3 is coupled to those cells of a page storing a portion of a respective sector of data of the page of data stored in the page of memory cells. That is, the cells coupled to a particular word line and to the subset of bit lines 622-0 store a portion of a first sector of data of the page, the cells coupled to the particular word line and to the subset of bit lines 622-1 store a portion of a second sector of data of the page, the cells coupled to the particular word line and to the subset of bit lines 622-2 store a portion of a third sector of data of the page, and the cells coupled to the particular word line and to the subset of bit lines 622-3 store a portion of a fourth sector of data of the page.

As such, the portion of memory array 600 shown in FIG. 6 can be a physical portion (e.g., a tile) of a page (e.g., a physical page) of memory cells. That is, the memory cells illustrated in FIG. 6 can form a tile of a page of memory cells. The page can include a number of additional tiles of memory cells in addition to the tile illustrated in FIG. 6. The additional tiles of the page (not shown in FIG. 6) can be in the same level (e.g., tier and/or control gate plate) of the three-dimensional array. That is, the page can include a plurality of tiles of memory cells in the same level of the three-dimensional array, one tile of which is illustrated in FIG. 6. As an example, the page can include 32 tiles. However, embodiments of the present disclosure are not limited to a particular number of tiles. Each memory cell of a tile (e.g., each cell of the tile illustrated in FIG. 6) can be coupled to a common control gate and the strings which include the cells of a particular tile can be controlled by the same (e.g., a common local) drain select line (e.g., drain select line 615). An example of a level of a three-dimensional array will be further described herein (e.g., in connection with FIG. 7).

The page of memory cells can comprise a number (e.g., a plurality) of sectors of cells, which can each store a number of sectors of data corresponding to a page of data stored in the page of cells, with each tile of the page storing a different portion of each sector. That is, different portions of each sector of data can be stored in different tiles. For example, in the embodiment illustrated in FIG. 6, the page can store four sectors (e.g., sector 0, sector 1, sector 2, and sector 3) of data, with the tile illustrated in FIG. 6 storing a portion (e.g., not all) of sector 0, a portion of sector 1, a portion of sector 2, and a portion of sector 3. The other (e.g., remaining) portions of sectors 0, 1, 2, and 3 can be stored in the other tiles of the page (not shown in FIG. 6). Further, cells storing a particular sector of data of the page can be included in a plurality of NAND strings, wherein at least some of the NAND strings of the plurality of NAND strings are coupled to respective ones of the bit lines responsive to signals on different drain select lines.

As an example, the page of memory cells can store 16 kilobytes (kB) of data, with each of the sectors of cells storing 4 kB of data, each of the tiles (e.g., the tile illustrated in FIG. 6) storing 512 bytes (B) of data, and the portion of each sector stored by each tile including 128 B of data. However, embodiments of the present disclosure are not limited to a particular sector size, a particular page size, a particular number of sectors per page, a particular tile size.

Memory device 630 can include a number (e.g., a plurality) of page buffers associated with each different tile of the page. For example, in the embodiment illustrated in FIG. 6, memory device 630 includes four page buffers 632-0, 632-1, 632-2, and 632-3 associated with the tile shown in FIG. 6, wherein the four page buffers collectively form a tile page buffer 638. That is, tile page buffer 638 includes the four page buffers 632-0, 632-1, 632-2, and 632-3. Further, each page buffer associated with a particular tile can be associated with a different sector portion stored by that tile. For example, in the embodiment illustrated in FIG. 6, page buffer 632-0 is associated with the portion of sector 0 stored by the tile, page buffer 632-1 is associated with the portion of sector 1 stored by the tile, page buffer 632-2 is associated with the portion of sector 2 stored by the tile, and page buffer 632-3 is associated with the portion of sector 3 stored by the tile. As an additional example, each page buffer can be configured to store the same amount of data as is stored in its associated sector portion. For instance, in the embodiment illustrated in FIG. 6, each page buffer 632-0, 632-1, 632-2, and 632-3 is configured to store 128 B of data (e.g., each page buffer can be a 128 B page buffer). However, embodiments of the present disclosure are not limited to a particular number of page buffers or a particular amount of data storable in the page buffers.

In a number of embodiments of the present disclosure, a page of memory cells coupled to an activated word line can be sensed by separately pre-charging each of a plurality of subsets of bit lines coupled to the page, wherein each subset is coupled to those memory cells storing a different sector of data of the page, and separately sensing each of the subsets to separately determine each of the sectors of data. That is, each of the subsets of bit lines can be pre-charged and sensed one at a time, and each of the sectors of data can be determined one at a time as part of a continuous sense operation to sense the entire page. For example, in the embodiment illustrated in FIG. 6, the data of sector 0, sector 1, sector 2, and sector 3 can be separately determined in a manner analogous to sectors 0, 1, 2, and 3 previously described in connection with FIG. 4.

The subsets of bit lines can be separately pre-charged and separately sensed using, for example, a controller (not shown in FIG. 6) such as, for instance, controller 762 further described in connection with FIG. 7. For example, the controller can separately pre-charge and separately sense the subsets of bit lines in response to receiving a command (e.g., a read command) to separately determine (e.g., read) each sector of data. The command can be, for example, received from a host (not shown in FIG. 6), and can include the addresses (e.g., the LBAs) of the each sector (e.g., to identify each sector whose data is to be determined).

As an example, a page of memory cells can be sensed by pre-charging one (e.g., only one) of the subsets of bit lines, activating a word line coupled to the page of memory cells, activating the page buffer associated with the one subset of bit lines, outputting the data from the activated page buffer, and, while the access line is (e.g., remains) activated, separately pre-charging each of the remaining subsets of bit lines (e.g., while outputting the data from the previously activated page buffer), separately activating each of the remaining page buffers (e.g., the page buffers associated with the remaining subsets of bit lines), and separately outputting the data from the remaining page buffers after activation.

As an example, in the embodiment illustrated in FIG. 6, the bit line subsets associated with each portion of sector 1 (e.g., bit line subset 622-1) can be pre-charged, a word line coupled to the page (e.g., word line 605-3) can be activated (e.g., after pre-charging bit line subset 622-1), the page buffers associated with each portion of sector 1 (e.g., page buffer 632-1) can be activated (e.g., after activating word line 605-3), and data can be output from the activated page buffers (e.g., from activated page buffer 632-1). Then, while word line 605-3 is activated, the bit line subsets associated with each portion of sector 3 (e.g., bit line subset 622-1) can be pre-charged, the page buffers associated with each portion of sector 3 (e.g., page buffer 632-3) can be activated, and data can be output from the activated page buffers (e.g., from activated page buffer 632-3). Then, while word line 605-3 is activated, the bit line subsets associated with each portion of sector 0 (e.g., bit line subset 622-0) can be pre-charged, the page buffers associated with each portion of sector 0 (e.g., page buffer 632-0) can be activated, and data can be output from the activated page buffers (e.g., from activated page buffer 632-0). Finally, while word line 605-3 is activated, the bit line subsets associated with each portion of sector 2 (e.g., bit line subset 622-2) can be pre-charged, the page buffers associated with each portion of sector 2 (e.g., page buffer 632-2) can be activated, and data can be output from the activated page buffers (e.g., from activated page buffer (632-2). Further, the bit line subsets associated with each portion of sector 3 can be pre-charged while the data is output from the activated page buffers associated with each portion of sector 1, the bit line subsets associated with each portion of sector 0 can be pre-charged while the data is output from the activated page buffers associated with each portion of sector 3, and the bit line subsets associated with each portion of sector 2 can be pre-charged while the data is output from the activated page buffers associated with each portion of sector 0. Embodiments of the present disclosure, however, are not limited to a particular order for pre-charging and sensing the bit line subsets, as previously described herein.

Each subset of bit lines associated with each portion of a respective sector can be pre-charged by, for instance, applying a pre-charge signal thereto. For example, in the embodiment illustrated in FIG. 6, bit line subset 622-1 can be pre-charged by applying pre-charge signal 634-1 (e.g., Vpre1) thereto via page buffer 632-1, bit line subset 622-3 can be pre-charged by applying pre-charge signal 634-3 (e.g., Vpre3) thereto, bit line subset 622-0 can be pre-charged by applying pre-charge signal 634-0 (e.g., Vpre0) thereto, bit line portion 622-2 can be pre-charged by applying pre-charge signal 634-2 (e.g., Vpre2) thereto. Pre-charge signals 634-0, 634-1, 634-2, and 634-3 can be, for example, analogous to pre-charge signals 434-0, 434-1, 434-2, and 434-3 previously described in connection with FIG. 4.

The word line coupled to the page of memory cells can be activated after pre-charging the bit line subset associated with the first of the sectors to be sensed (e.g., after applying the pre-charge signal to the bit line subsets associated with each portion of the first sector). The word line can be activated by, for instance, applying a sensing signal to the word line and applying a pass signal to the additional (e.g., remaining) word lines coupled to the page, SGD 619, and SGS 613. For example, in the embodiment illustrated in FIG. 6, word line 605-3 can be activated by applying a sensing signal thereto and applying a pass signal to the un-activated access lines, SGD 619, and SGS 613. The sensing signal and the pass signal can be, for example, analogous to the sensing signal and the pass signal, respectively, previously described in connection with FIG. 4.

The page buffers associated with each portion of a respective sector can be activated by, for instance, applying an activation signal to those page buffers while the word line coupled to the page is activated (e.g., while the sensing signal is applied to the word line) and after pre-charging the bit line subsets associated with each portion of that respective sector. For example, in the embodiment illustrated in FIG. 6, page buffer 632-1 can be activated by applying activation signal 636-1 (e.g., Vact1) to page buffer 632-1 while word line 605-3 is activated and after pre-charging bit line subset 622-1, page buffer 632-3 can be activated by applying activation signal 636-3 (e.g., Vact3) to page buffer 632-3 while word line 605-3 is activated and after pre-charging bit line subset 622-3, page buffer 632-0 can be activated by applying activation signal 636-0 (e.g., Vact0) to page buffer 632-0 while word line 605-3 is activated and after pre-charging bit line subset 622-0, and page buffer 632-2 can be activated by applying activation signal 636-2 (e.g., Vact2) to page buffer 632-2 while word line 605-3 is activated and after pre-charging bit line subset 622-2. Activation signals 636-0, 636-1, 636-2, and 636-3 can be, for example, analogous to activation signals 436-0, 436-1, 436-2, and 436-3 previously described in connection with FIG. 4. Each respective activated page buffer associated with a particular tile can then store the data (e.g., the data of the sector portion associated with that page buffer) and/or output (e.g., send) the data to the controller.

Figure 7:
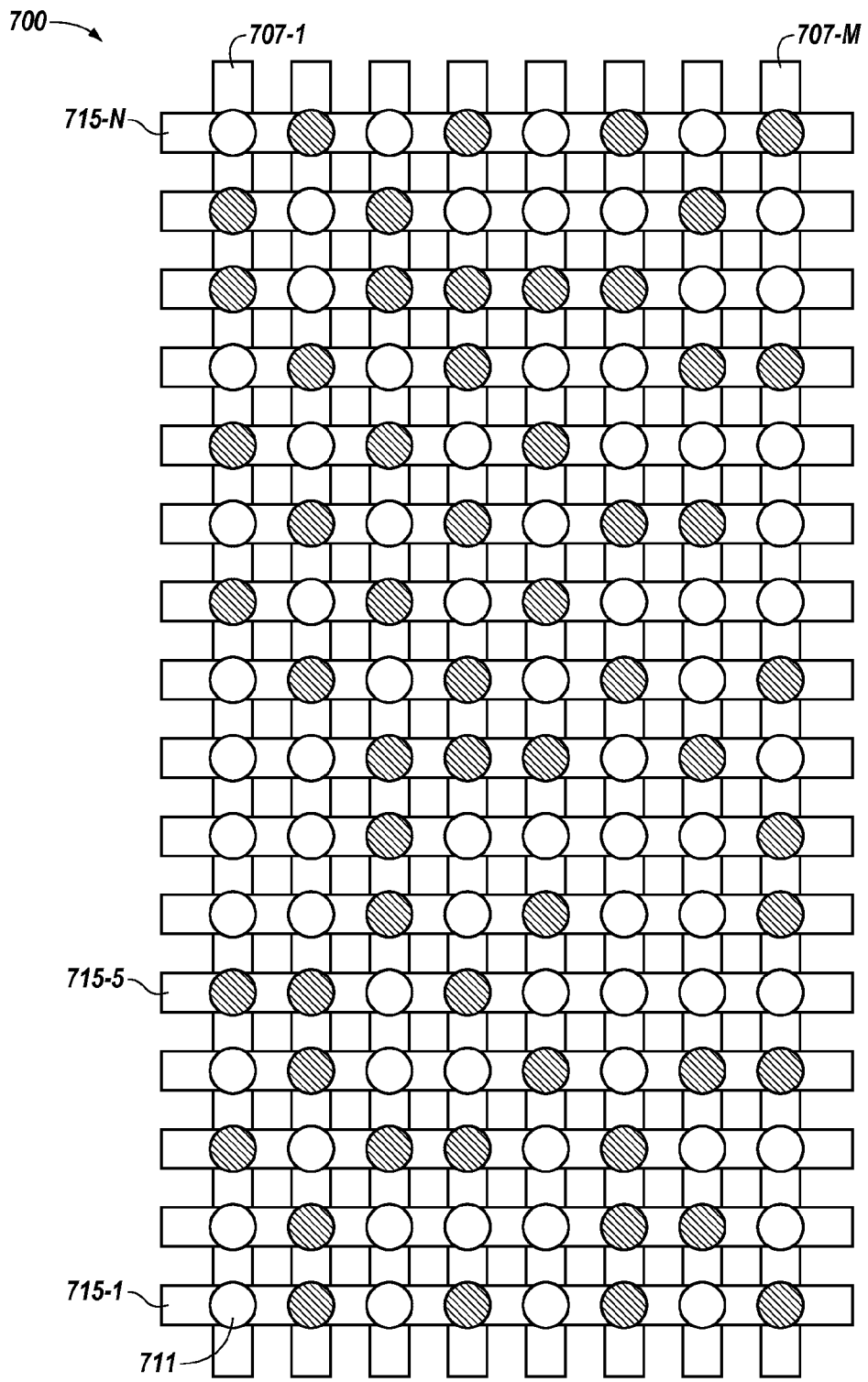
FIG. 7 illustrates a diagram of a portion of a non-volatile memory array in accordance with a number of embodiments of the present disclosure.

FIG. 7 illustrates a diagram of a portion of a non-volatile memory array 700 in accordance with a number of embodiments of the present disclosure. Memory array 700 can be a level (e.g., tier and/or control gate plate) of a three-dimensional array (e.g., a multi-level array) in which other arrays similar to array 700 are at different levels, for example above and/or below array 700. For instance, memory array 700 can be the third level of a 32-level array. However, embodiments of the present disclosure are not limited to a particular number of levels.

As shown in FIG. 7, memory array 700 (e.g., a level of a three-dimensional array in accordance with a number of embodiments of the present disclosure) includes drain select lines (e.g., drain select lines 715-1, . . . , 715-N) and intersecting bit lines (e.g., bit lines 707-1, . . . , 707-M). A non-volatile memory cell can be located at the intersection of each drain select line and bit line, as shown in FIG. 7. For example, in the embodiment illustrated in FIG. 7, memory cell 711 is located at the intersection of drain select line 715-1 and bit line 707-1.

Each memory cell can be a part of a cell pillar (e.g., a vertical cell pillar) of the three-dimensional array. As an example, a physical block of the three-dimensional array may include 16 cell pillars. However, embodiments of the present disclosure are not so limited. Further, each memory cell can be programmed to a targeted one of two different data states, which can be represented by the binary units 1 or 0. For instance, in the embodiment illustrated in FIG. 7, the memory cells programmed to data state 1 are shaded, and the memory cells programmed to data state 0 are not shaded.

In a number of embodiments of the present disclosure, while array 700 is selected for sensing, a number of sectors of data (e.g., a number of sectors each storing 4 kB of data) can be sensed with respect to a first drain select line (e.g., drain select line 715-1), and then a number of sectors of data can be sensed with respect to a second drain select line (e.g., drain select line 715-5). That is, a sector of data can be sensed by changing from the first drain select line to the second drain select line while array 700 is selected for sensing. A timing diagram including a number of signals associated with such a sensing operation will be further described herein (e.g., in connection with FIG. 8).

Figure 8:
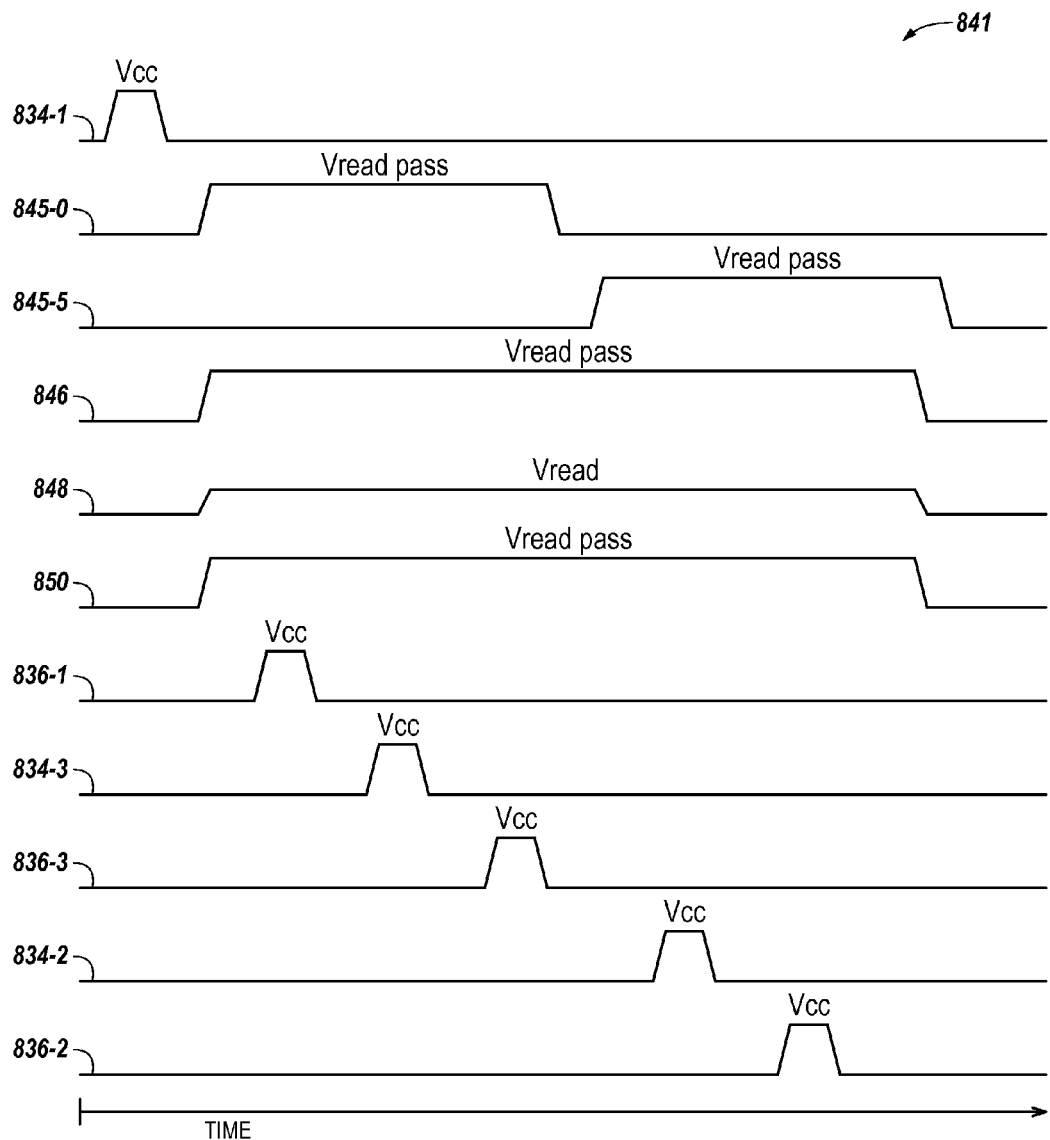
FIG. 8 illustrates a timing diagram including a number of signals associated with sensing a page of memory cells in accordance with a number of embodiments of the present disclosure.

FIG. 8 illustrates a timing diagram 841 including a number of signals associated with sensing a page of memory cells in accordance with a number of embodiments of the present disclosure. The page of memory cells can comprise a number of sectors of cells which can each store a number of sectors of data corresponding to a page of data stored in the physical page of cells, in a manner analogous to that previously described in connection with FIG. 6.

As shown in FIG. 8, timing diagram 841 includes signal 834-1. Signal 834-1 can correspond to, for example, pre-charge signal 634-1 (e.g., Vpre1) previously described in connection with FIG. 6. For instance, a first subset of bit lines can be pre-charged by applying signal 634-1 thereto in a manner analogous to that previously described in connection with FIG. 6. As shown in FIG. 8, signal 834-1 can have a positive polarity and an amplitude of Vcc.

As shown in FIG. 8, timing diagram 841 includes signals 845-0 and 845-5. Signal 845-0 can be applied to a first drain select line (e.g., drain select line 715-1 previously described in connection with FIG. 7) of a level (e.g., tier) of a three dimensional memory array while the level is selected for sensing, and signal 845-5 can be applied to a second drain select line (e.g., drain select line 715-5 previously described in connection with FIG. 7) of the level of the three-dimensional array while the level is selected for sensing.

As shown in FIG. 8, signals 845-0 and 845-5 can have a positive polarity and an amplitude of Vread pass. Vread pass can be, for example, 7 Volts. However, embodiments of the present disclosure are not limited to a particular voltage amount for Vread pass. Further, as shown in FIG. 8, signals 845-0 and 845-5 can be applied after signal 834-1 is applied to the first subset of bit lines, signal 845-5 can be applied to the second drain select line after signal 845-0 is applied to the first drain select line, signals 845-0 and 845-5 can have a longer duration than signal 834-1, and signals 845-0 and 845-5 can have the same duration.

As shown in FIG. 8, timing diagram 841 includes signals 846, 848, and 850. Signal 848 can correspond to, for example, the sensing signal previously described in connection with FIG. 6, and signals 846 and 850 can correspond to, for example, the pass signal previously described in connection with FIG. 6. For instance, a word line coupled to the page of memory cells can be activated by applying signal 848 to the word line, applying signal 846 to the additional (e.g., remaining) word lines coupled to the page, and applying signal 850 to the SGS (e.g., SGS 613), in a manner analogous to that previously described in connection with FIG. 6.

As shown in FIG. 8, signal 848 can have a positive polarity and an amplitude of Vread, and signals 846 and 850 can have a positive polarity and an amplitude of Vread pass. Vread can be, for example, 4 Volts. However, embodiments of the present disclosure are not limited to a particular voltage amount for Vread. Further, as shown in FIG. 8, signals 846, 848, and 850 can be applied after signal 834-1 is applied to the first subset of bit lines and while signals 845-0 and 845-5 are applied to the first and second drain select lines, respectively, signals 846, 848, and 850 can have a longer duration than signals 834-1, 845-0, and 845-5, and signals 846, 848, and 850 can have the same duration.

As shown in FIG. 8, timing diagram 841 includes signal 836-1. Signal 836-1 can correspond to, for example, activation signal 636-1 (e.g., Vact1) previously described in connection with FIG. 6. For instance, a page buffer associated with a first sector of data can be activated by applying signal 836-1 thereto in a manner analogous to that previously described in connection with FIG. 6.

As shown in FIG. 8, signal 836-1 can have a positive polarity and the same amplitude as signal 834-1 (e.g., Vcc). Further, as shown in FIG. 5, signal 836-1 can be applied to the page buffer associated with the first sector of data after signal 834-1 is applied to the first subset of bit lines and while signals 845-0, 846, 848, and 850 are being applied, signal 836-1 can have the same duration as signal 834-1, and signal 836-1 can have a shorter duration than signals 845-0, 846, 848, and 850.

As shown in FIG. 8, timing diagram 841 includes signal 834-3. Signal 834-3 can correspond to, for example, pre-charge signal 634-3 (e.g., Vpre3) previously described in connection with FIG. 6. For instance, a second subset of bit lines can be pre-charged by applying signal 834-3 thereto in a manner analogous to that previously described in connection with FIG. 6.

As shown in FIG. 8, signal 834-3 can have a positive polarity and the same amplitude as signals 834-1 and 836-1 (e.g., Vcc). Further, as shown in FIG. 8, signal 834-3 can be applied to the second subset of bit lines after signals 834-1 and 836-1 are applied and while signals 845-0, 846, 848, and 850 are being applied, signal 834-3 can have the same duration as signals 834-1 and 836-1, and signal 834-3 can have a shorter duration than signals 845-0, 846, 848, and 850.

As shown in FIG. 8, timing diagram 841 includes signal 836-3. Signal 836-3 can correspond to, for example, activation signal 636-3 (e.g., Vact3) previously described in connection with FIG. 6. For instance, a page buffer associated with a second sector of data can be activated by applying signal 836-3 thereto in a manner analogous to that previously described in connection with FIG. 6.

As shown in FIG. 8, signal 836-3 can have a positive polarity and the same amplitude as signals 834-1, 836-1, and 834-3 (e.g., Vcc). Further, as shown in FIG. 8, signal 836-3 can be applied to the page buffer associated with the second sector of data after signals 834-1, 836-1, and 834-3 are applied and while signals 845-0, 846, 848, and 850 are being applied, signal 836-3 can have the same duration as signals 834-1, 836-1, and 834-3, and signal 836-3 can have a shorter duration than signals 845-0, 846, 848, and 850.

As shown in FIG. 8, timing diagram 841 includes signal 834-2. Signal 834-2 can correspond to, for example, pre-charge signal 634-2 (e.g., Vpre2) previously described in connection with FIG. 6. For instance, a third subset of bit lines can be pre-charged by applying signal 834-2 thereto in a manner analogous to that previously described in connection with FIG. 6.

As shown in FIG. 8, signal 834-2 can have a positive polarity and the same amplitude as signals 834-1, 836-1, 834-3, and 836-3 (e.g., Vcc). Further, as shown in FIG. 8, signal 834-2 can be applied to the third subset of bit lines after signals 834-1, 845-0, 836-1, 834-3, and 836-3 are applied and while signals 845-5, 846, 848, and 850 are being applied, signal 834-2 can have the same duration as signals 834-1, 836-1, 834-3, and 836-3, and signal 834-2 can have a shorter duration than signals 845-5, 846, 848, and 850.

As shown in FIG. 8, timing diagram 841 includes signal 836-2. Signal 836-2 can correspond to, for example, activation signal 636-2 (e.g., Vact2) previously described in connection with FIG. 6. For instance, a page buffer associated with a third sector of data can be activated by applying signal 836-2 thereto in a manner analogous to that previously described in connection with FIG. 6.

As shown in FIG. 8, signal 836-2 can have a positive polarity and the same amplitude as signals 834-1, 836-1, 834-3, 836-3, and 834-2 (e.g., Vcc). Further, as shown in FIG. 8, signal 836-2 can be applied to the page buffer associated with the third sector of data after signals 834-1, 845-0, 836-1, 834-3, 836-3, and 834-2 are applied and while signals 845-5, 846, 848, and 850 are being applied, signal 836-2 can have the same duration as signals 834-1, 836-1, 834-3, 836-3, and 834-2, and signal 836-2 can have a shorter duration than signals 845-5, 846, 848, and 850.

Although not shown in FIG. 8, timing diagram 841 can also include signals that correspond to pre-charge signal 634-0 (e.g., Vpre0) and activation signal 636-0 (e.g., Vact0) previously described in connection with FIG. 6. These signals can have a positive polarity and the same amplitude and duration as signals 834-1, 836-1, 834-3, 836-3, 834-2, and 836-2 (e.g., Vcc), and these signals can have a shorter duration than signals 845-5, 846, 848, and 850. These signals can be applied while signals 845-5, 846, 848, and 850 are being applied. The signal that corresponds to pre-charge signal 634-0 can be applied after signal 836-2 is applied, and the signal that corresponds to activation signal 636-0 can be applied after the signal that corresponds to pre-charge signal 634-0 is applied.

Figure 9:
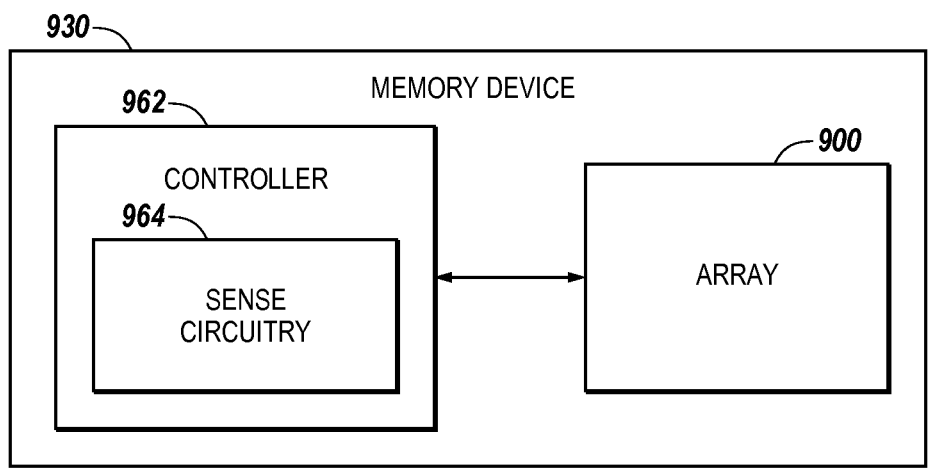
FIG. 9 illustrates a block diagram of an apparatus in the form of a memory device in accordance with a number of embodiments of the present disclosure.

FIG. 9 illustrates a block diagram of an apparatus in the form of a memory device 930 in accordance with a number of embodiments of the present disclosure. Memory device 930 can be, for example, memory device 330, 430, and/or 630 previously described in connection with FIGS. 3, 4, and 6, respectively. As used herein, an "apparatus" can refer to, but is not limited to, any of a variety of structures or combinations of structures, such as a circuit or circuitry, a die or dice, a module or modules, a device or devices, or a system or systems, for example.

As shown in FIG. 9, memory device 930 includes a controller 962 coupled to a memory array 900. Memory array 900 can be, for example, memory array 100, 200, 300, 400, 600, and/or 700 previously described in connection with FIGS. 1, 2, 3, 4, 6, and/or 7, respectively. Although one memory array is shown in FIG. 9, embodiments of the present disclosure are not so limited (e.g., memory device 930 can include more than one memory array coupled to controller 962).

Controller 962 can include, for example, control circuitry and/or firmware. For instance, controller 962 can include sense circuitry 964, as illustrated in FIG. 9. Controller 962 can be included on the same physical device (e.g., the same die) as memory array 900, or can be included on a separate physical device that is communicatively coupled to the physical device that includes memory array 900. In a number of embodiments, components of controller 962 can be spread across multiple physical devices (e.g., some components on the same die as the array, and some components on a different die, module, or board).

Sense circuitry 964 can perform sensing operations in accordance with a number of embodiments of the present disclosure to determine the state of the memory cells in memory array 900. For example, sense circuitry 964 can sense a page of memory cells coupled to an activated word line by pre-charging only a single (e.g., one) subset of a number of bit lines coupled to the page, wherein the single subset is coupled to those memory cells storing a single (e.g., one) sector of data of the page, and sensing the single subset of bit lines to determine the single sector of data, in accordance with a number of embodiments of the present disclosure. As an additional example, sense circuitry 964 can sense a page of memory cells coupled to an activated word line by separately pre-charging each of a plurality of subsets of bit lines coupled to the page, wherein each subset is coupled to those memory cells storing a different sector of data of the page, and separately sensing each of the subsets to separately determine each of the sectors of data, in accordance with a number of embodiments of the present disclosure.

The embodiment illustrated in FIG. 9 can include additional circuitry that is not illustrated so as not to obscure embodiments of the present disclosure. For example, memory device 930 can include address circuitry to latch address signals provided over I/O connectors through I/O circuitry. Address signals can be received and decoded by a row decoder and a column decoder, to access memory array 900.

CONCLUSION

The present disclosure includes apparatuses and methods for sensing data stored in memory. A number of embodiments include an array of memory cells, and a controller coupled to the array and configured to sense a page of memory cells coupled to an activated access line by pre-charging only a single subset of a number of data lines coupled to the page, wherein more than two subsets of data lines are coupled to the page and the single subset is coupled to those memory cells storing at least a portion of a single sector of data of the page, and sensing the single subset of the number of data lines to determine the at least a portion of the single sector of data.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   an array of memory cells; and
   a controller coupled to the array and configured to sense a page of memory cells coupled to an access line by:
   pre-charging only a single subset of a number of data lines coupled to the page, wherein the data lines of the single subset include at least two data lines that are directly adjacent to each other; and
   activating the access line after pre-charging the single subset of the number of data lines.

2. The apparatus of claim 1, wherein more than two subsets of data lines are coupled to the page.

3. The apparatus of claim 1, wherein the single subset of the number of data lines is coupled to those memory cells of the page storing at least a portion of a single sector of data of the page.

4. The apparatus of claim 1, wherein the controller is configured to sense the single subset of the number of data lines after activating the access line.

5. The apparatus of claim 1, wherein the controller is configured to sense the page of memory cells as part of a continuous sense operation.

6. The apparatus of claim 1, wherein:
the page of memory cells includes a number of physical portions of memory cells; and
the apparatus includes a number of buffers associated with each physical portion.

7. A method for operating memory, comprising:
pre-charging only one subset of a number of data lines coupled to a page of memory cells, wherein the data lines of the one subset include at least two data lines that are directly adjacent to each other;
activating an access line coupled to the page of memory cells after pre-charging the one subset of the number of data lines; and
sensing the one subset of the number of data lines.

8. The method of claim 7, wherein:
the one subset is coupled to those memory cells of the page storing at least a portion of one sector of data of the page; and
sensing the one subset of the number of data lines includes determining the at least a portion of the one sector of data.

9. The method of claim 7, wherein the method includes:
pre-charging only a second subset of the number of data lines coupled to the page while the access line remains activated and after sensing the one subset of the number of data lines; and
sensing the second subset of the number of data lines.

10. The method of claim 7, wherein the method includes:
applying a signal to only one of a number of drain select lines after activating the access line; and
sensing the one subset of the number of data lines while the signal is applied to the one of the number of drain select lines.

11. The method of claim 7, wherein activating the access line coupled to the page of memory cells includes applying a sensing signal to the access line.

12. The method of claim 7, wherein activating the access line coupled to the page of memory cells includes applying a pass signal to additional access lines of a block of memory cells including the page of memory cells.

13. The method of claim 7, wherein the method includes:
using a controller to pre-charge the one subset of the number of data lines;
using a controller to activate the access line coupled to the page of memory cells; and
using a controller to sense the one subset of the number of data lines.

14. An apparatus, comprising:
an array of memory cells; and
a controller coupled to the array and configured to sense a page of memory cells coupled to an access line by:
pre-charging only a first subset of a number of data lines coupled to the page, wherein the data lines of the first subset include at least two data lines that are directly adjacent to each other;
activating the access line after pre-charging the first subset of the number of data lines; and
while the access line remains activated, pre-charging only a second subset of the number of data lines, wherein the data lines of the second subset include at least two data lines that are directly adjacent to each other.

15. The apparatus of claim 14, wherein:
the first subset of the number of data lines is coupled to those memory cells of the page storing at least a portion of a first sector of data of the page; and
the second subset of the number of data lines is coupled to those memory cells of the page storing at least a portion of a second sector of data of the page.

16. The apparatus of claim 14, wherein the controller is configured to:
sense the first subset of the number of data lines after activating the access line and before pre-charging the second subset of the number of data lines; and
sense the second subset of the number of data lines after pre-charging the second subset.

17. The apparatus of claim 14, wherein the array of memory cells is a three-dimensional array.

18. The apparatus of claim 14, wherein the controller is configured to sense the page of memory cells in response to receiving a read command from a host.

19. The apparatus of claim 14, wherein the controller is configured to pre-charge only a third subset of the number of data lines while the access line remains activated.

* * * * *